United States Patent [19]

Kominami et al.

[11] 4,264,873
[45] Apr. 28, 1981

[54] DIFFERENTIAL AMPLIFICATION CIRCUIT

[75] Inventors: Yasuo Kominami, Kokubunji; Masahiro Yamamura, Kodaira; Katsuji Mizumoto; Toshihide Hanada, both of Sayama, all of Japan

[73] Assignees: Hitachi, Ltd.; Pioneer Electronic Corporation, both of Tokyo, Japan

[21] Appl. No.: 56,422

[22] Filed: Jul. 10, 1979

[30] Foreign Application Priority Data

Jul. 19, 1978 [JP] Japan ................... 53/87175

[51] Int. Cl.³ .......................... H03F 3/45; H03F 3/04
[52] U.S. Cl. ..................................... 330/257; 330/288
[58] Field of Search ................................ 330/288, 257

[56] References Cited

U.S. PATENT DOCUMENTS

| 3,564,439 | 2/1971 | Rao ........................... 330/257 |
| 3,922,614 | 11/1975 | de Plassche ............... 330/257 |
| 3,932,768 | 1/1976 | Takahashi et al. ......... 330/257 |
| 4,013,898 | 3/1977 | Makino ...................... 330/257 |

Primary Examiner—Harold A. Dixon
Attorney, Agent, or Firm—Craig and Antonelli

[57] ABSTRACT

A differential amplification is disclosed which comprises differential paired transistors. The direct bias current flowing in the differential paired transistors is determined by a constant current flowing from a first constant current circuit connected to the emitters of the differential paired transistors. The collector current of one of the differential paired transistors is caused to flow as an input current in a high-precision current mirror circuit. The current value of the constant current flowing in the first constant current circuit is set at 2Io. Since a direct base current Ib flows in the differential paired transistors, the current value of the collector current of one of the differential paired transistors is (Io−Ib). Accordingly, the high-precision current mirror circuit generates an output current of a current value of (Io−Ib) at the output terminal thereof. The differential amplification circuit includes a second constant current circuit having a current value Io corresponding to ½ of the current value of the constant current flowing in the first constant current circuit. A bias transistor is connected between the high-precision current mirror circuit and the second constant current circuit, and the direct base current Ib flows in this bias transistor. Accordingly, in the equilibrium state between the differential paired transistors, the output current appearing at the output terminal of the high precision current mirror circuit becomes zero, and the offset output current can be eliminated or moderated.

3 Claims, 4 Drawing Figures

DIFFERENTIAL AMPLIFICATION CIRCUIT

BACKGROUND OF THE INVENTION

The present invention relates to a differential amplification circuit.

We previously developed a differential amplification circuit as shown in FIG. 3. This circuit comprises differential transistors Q10 and Q11, a constant current circuit CS1 provided at a common emitter of these transistors to flow a constant current 2Io, a high-precision current mirror circuit 1 provided at a collector of one transistor Q11 and a constant current circuit CS2 mounted on the output side of the current mirror circuit, where the constant current value is set at ½ of the value of the above-mentioned constant current 2Io.

This circuit puts out the difference ($I_1'$ – Io) between the output current $I_1'$ from the high-precision current mirror circuit 1 and the current Io flowing in the constant current circuit CS2, and the circuit is arranged so that in the state where the differential transistors are well-balanced with each other, this current difference shall be maintained at zero. By this arrangement, it is made possible to use a region of a good linearity of the transmission characteristic in the differential amplification circuit.

In the state where input voltages Vin and Vref applied to the bases of the differential transistors Q10 and Q11 are well-balanced with each other, each of the emitter currents of the transistors Q10 and Q11 is Io. Accordingly, supposing that the base current of the transistor Q11 is expressed as Ib, $I_1$ is equal to (Io – Ib), and in the high-precision current mirror circuit 1, the ratio of the input current $I_1$ to the output current $I_1'$ becomes equal to substantially 1. Therefore, the output current $I_1'$ of the current mirror circuit 1 is substantially equal to (Io – Ib).

Since the constant current circuit CS2 as the output circuit is for flowing the current Io, in the input-balanced state an offset output current of –Ib is generated in the output current.

We made investigations on a method of causing offset in emitter bias current values of the input differential transistors for reducing the offset output current to zero.

However, since production of a difference in bias currents results in a change of the temperature characteristic dVbe/dT of the base-emitter voltages Vbe in the forward direction of the transistors, the output of this differential amplification circuit is changed according to the temperature change. Furthermore, the above base current Ib per se is changed depending on the temperature because of the temperature characteristic of the common emitter current amplification rate hfe. Thus, it has been found that the offset quantity per se has a temperature dependency or temperature characteristic and the output is changeable depending on the temperature change and is hence unstable.

SUMMARY OF THE INVENTION

It is therefore a primary object of the present invention to provide a differential amplification circuit in which the output stability against the temperature change is improved.

In accordance with the fundamental aspect of the present invention, this object can be attained by an arrangement in which a transistor is disposed in series to a constant current circuit on the output side of a high-precision current mirror circuit and the current at the collector of this transistor is set at a value obtained by subtracting the base current from the emitter current of the constant current.

DETAILED DESCRIPTION OF THE PREFERRED EMBODIMENTS

The present invention will now be described in detail by reference to embodiments illustrated in the accompanying drawings.

Figure 1:
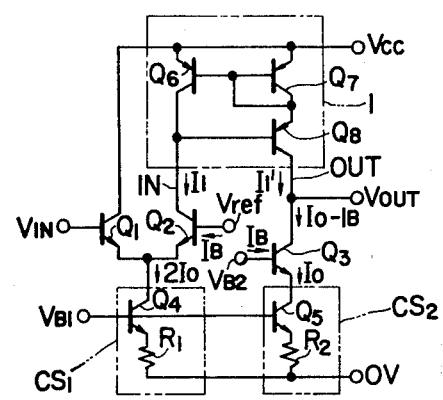
FIG. 1 is a diagram illustrating one embodiment of the differential amplification circuit according to the present invention.

FIG. 1 is a circuit illustrating one embodiment of the present invention.

The circuit shown in FIG. 1 comprises differential transistors Q1 and Q2, a constant current circuit Cs1 provided at a common emitter of the transistors Q1 and Q2 to flow a constant current 2Io, a high-precision current mirror circuit 1 provided at a collector of one transistor Q2, a constant current circuit CS2 provided at the output side of the current mirror circuit 1, in which the constant current value Io is set at ½ of the current value of 2Io of the constant current flowing in said constant current circuit CS1, and a transistor Q3 disposed between said constant current circuit CS2 and the output of said high-precision current mirror circuit 1, a predetermined bias voltage Vb2 being applied to the base of said transistor Q3 and an output current being obtained from the collector of said transistor Q3.

The constant current circuits CS1 and CS2 comprise transistors Q4 and Q5, in which a constant voltage Vb1 for obtaining a constant current is applied to the bases and resistances R1 and R2 are connected to the emitters to set the constant current values 2Io and Io, respectively.

The high-precision current mirror circuit 1 comprises a transistor Q8 disposed to correct the difference between the input current $I_1$ and the output current $I_1'$ and transistors Q6 and Q7 having common base and emitter. Namely, the transistor Q8 divides the base current for driving the transistors Q6 and Q7 equally into the output and input and makes both the currents equal to each other.

More specifically, supposing that the common emitter current amplification rate of each of the transistors Q6, Q7 and Q8 constituting the high-precision current mirror circuit is hfep, the ratio of the output current $I_1'$ to the input current $I_1$ is represented by the following formula and when this hfep value is sufficiently larger than 2, this ratio is equal to approximately 1:

$$\frac{I_1'}{I_1} = \frac{hfep^2 + 2hfep}{hfep^2 + 2hfep + 2} \approx 1$$

As pointed out hereinbefore, when the differential transistors Q1 and Q2 are well-balanced, the collector current of each transistor is (Io – Ib) and this current (Io−Ib) flows as the input current $I_1$ in the high-precision current mirror circuit 1 (Ib stands for the direct base current flowing in the transistor Q2).

Accordingly, in this high-precision current mirror circuit, an output current $I_1'$ substantially equal to this input current $I_1$ appears on the output terminal Vout.

Since good matching is established between the characteristics of the transistor Q2 and the characteristics of the transistor Q3, the direct base current of the transistor Q3 is substantially equal to the direct base current Ib of the transistor Q2.

Accordingly, the current (Io−Ib) flows in the collector of the transistor Q3. Thus, when the differential transistors Q1 and Q2 are well-balanced with each other, the output current appearing on the output terminal Vout is substantially zero.

Since the base currents Ib of the transistors Q2 and Q3 are similarly changed depending on the temperature and the common emitter current amplification rates of these transistors are similarly changed depending on the temperature, the influence of the temperature can be compensated.

Especially when the circuit of this embodiment is formed in a monolithic semiconductor integrated circuit, good agreement (pairing property) can be obtained between the characteristics of the transistor Q2 and the characteristics of the transistor Q3, and the influences of the temperature are equal in these transistors. Therefore, a very stable output can be obtained irrespectively of temperature changes.

Theoretically, the above object of the present invention can similarly be attained by setting the constant current value of the constant current circuit CS2 at a level of (Io−Ib) even without provision of the transistor Q3. However, by existent techniques in the field of semiconductors, it is practically impossible to attain this object throughout the entire temperature region according to this method.

The present invention is not limited to the above-mentioned embodiment but includes various modifications.

Figure 2A:
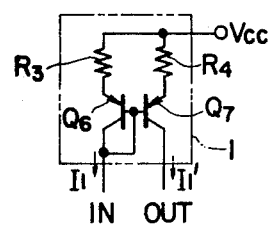
FIGS. 2(a) and 2(b) are diagrams illustrating modifications of the high-precision current mirror circuit.
Figure 2B:
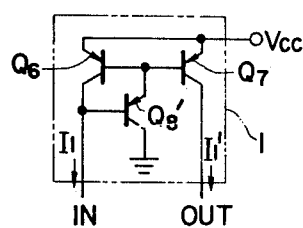
Figure 3:
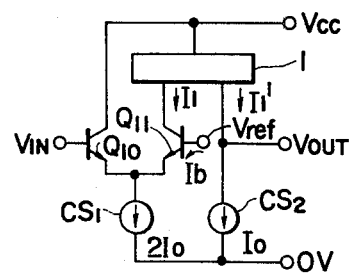
FIG. 3 is a diagram illustrating the differential amplification circuit previously developed by us.

For example, high-precision current mirror circuits 1 shown in FIGS. 2(a) and 2(b) can be used.

In the current mirror circuit 1 shown in FIG. 2(a), the current $I_1'$ on the output side (OUT) corresponds to subtraction of the base currents of the transistors Q6 and Q7 from the current $I_1$ on the input side (IN). Accordingly, transistors having a very high common emitter current amplification rate, for example, 50, are used as the transistors Q6 and Q7.

In the current mirror circuit 1 shown in FIG. 2(b), the emitter and collector of a transistor Q8' are connected to the base and collector of the transistor Q6 in order to decrease the error or difference between the input current $I_1$ and output current $I_1'$ by the base currents of the transistors Q6 and Q7.

Figure 4:
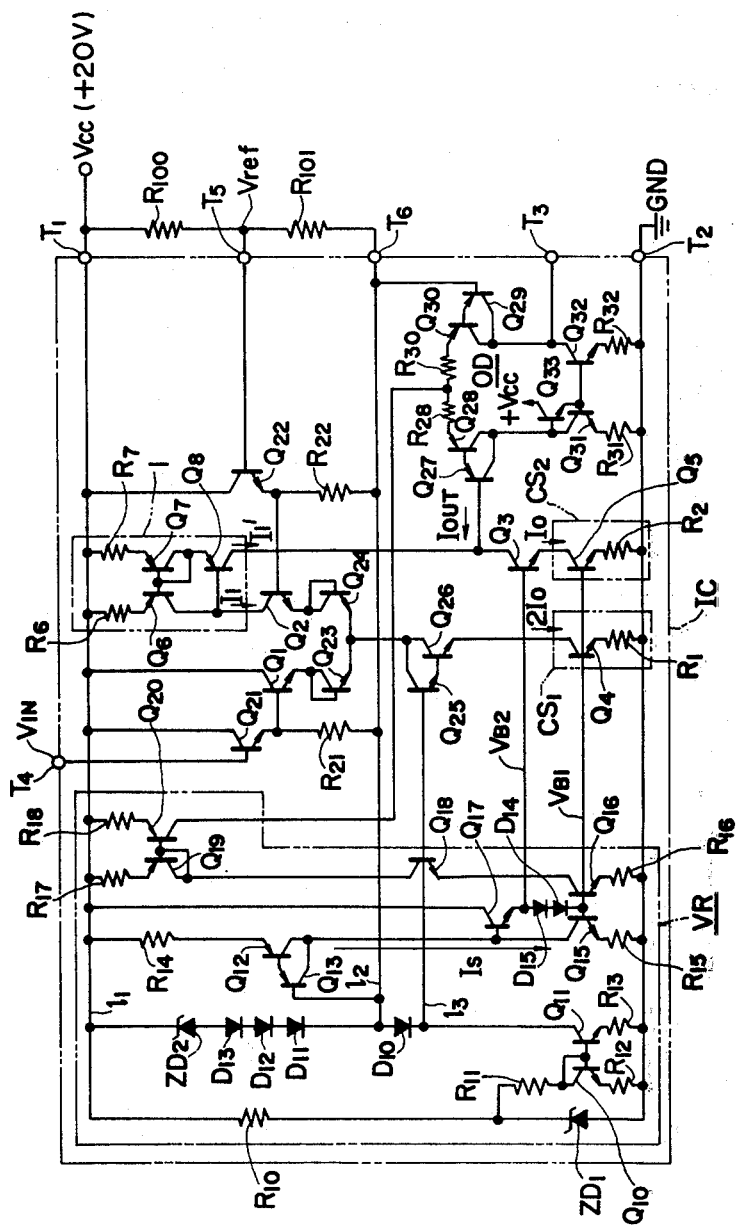
FIG. 4 is a diagram illustrating a specific embodiment of application of the differential amplification circuit according to the present invention.

FIG. 4 is a most concrete embodiment of the present invention.

In FIG. 4, all the circuit elements surrounded by a broken line IC are formed on a silicon chip according to known methods, and the main part of the circuit is composed of a semiconductor integrated circuit.

In a constant voltage regulator VR a resistance R10 and a zener diode ZD1 are connected in series between a power supply terminal T1 and an earth terminal T2.

Accordingly, a substantially constant zener voltage Vz1 generated between both the terminals of the zener diode ZD1 causes a substantially constant current to flow in a series circuit including resistances R11 and R12 and a transistor Q10, and therefore, a substantially constant current is caused to flow in a series circuit including a transistor Q11 and a resistance R13.

By flowing of this substantially constant current through diodes D10 through D13 and a zener diode ZD2, high-precision voltage differences are generated among lines 11, 12 and 13.

Accordingly, the current flowing in a series circuit including a resistance R14 and transistors Q12 and Q13 is approximately calculated according to the following formula:

$$Is = \frac{V_zD2 + V_fD11 + V_fD12 + V_fD13 - V_{be}Q12 - V_{be}Q13}{R14} \approx \frac{V_zD2 + V_fD11}{R14}$$

For example, when the zener voltage VzD2 of the zener diode ZD2 is 5.6 volts, the forward direction voltage of the diode D11 is 0.7 volt and the resistance value of the resistance R14 is 12.6 K−Ω, the value of this constant current Is is 0.5 mA.

If the resistance values of resistances R15 and R16 are equally adjusted to 1 KΩ, the value of the current flowing in a series circuit including transistor Q16 and resistance R16 becomes equal to the current value of the constant current Is.

The collector of the transistor Q16 is connected to a series circuit including a transistor Q19 and a resistance R17 through a transistor Q18. The transistor Q18 prevents the current flowing in the transistor Q16 from increasing remarkably over the constant current Is by the Early effect due to elevation of the power source voltage Vcc.

A current equal to the constant current Is also flows in a series circuit including resistance R18 and transistor Q20, and this current is supplied to an output differential amplification circuit OD constructed by transistors Q27 through Q33 and resistances R28 and R30 through R32.

If the resistance value of the resistance R1 of the constant current CS1 is adjusted to ½ of the resistance value of the resistance R15, that is, 500 Ω, and the emitter area of the transistor Q4 is adjusted to 2 times the emitter area of the transistor Q15, the current value 2Io of the current flowing in the constant current circuit CS1 is equal to a value 2 times the constant current Is flowing in the series circuit including the resistance R15 and transistor Q15.

If the resistance value of the resistance R2 of the constant current circuit CS2 is adjusted to a value equal to the resistance value of the resistance R15, that is, 1 KΩ, and the emitter area of the transistor Q5 is made equal to the emitter area of the transistor Q15, the value of the constant current Io flowing in the constant current circuit CS2 becomes equal to the current value of the above-mentioned constant current Is.

The emitters of the differential transistors Q1 and Q2 are connected to each other through the diode-connected transistors Q23 and Q24.

The transistors Q25 and Q26 connected in a Darlington mode prevent the value of the current flowing the constant current circuit CS1 from increasing remarkably over the predetermined value 2Io by the Early effect. Since the base current of the transistor Q25 can be neglected because of this Darlington connection, a current substantially equal to the constant current 2Io flowing in the constant current circuit CS1 flows in a common connection contact of the diodes Q23 and Q24.

The base of one transistor Q1 of the differential transistors Q1 and Q2 is connected to a terminal T4 through an emitter-follower circuit including the transistor Q21 and resistance R21, and the base of the other transistor Q2 is connected to a terminal T5 through an emitter-follower circuit including the transistor Q22 and resistance R22.

An input voltage Vin is applied to the terminal T4 and a referential voltage Vref divided by resistances R100 and R101 is applied to the terminal T5.

When the input voltage Vin becomes equal to the referential voltage Vref, an equilibrium state is brought about between the differential transistors Q1 and Q2 and the output current Iout appearing on the connection point of the collectors of the transistors Q8 and Q3 becomes zero.

What is claimed is:

1. A differential amplification circuit comprising:
   (1) differential paired transistors;
   (2) a high-precision current mirror circuit disposed between the collector of one of said paired transistors and a first voltage potential, the collector current of said one transistor being an input current of said high-precision current mirror circuit;
   (3) a first constant current circuit disposed between the emitters of said differential paired transistors and a second voltage potential of flow a predetermined constant current;
   (4) a second constant current for flowing a constant current substantially equal to ½ of the constant current of said first constant current circuit;
   (5) a bias transistor disposed between the output of said high-precision current mirror circuit and said second constant current circuit, a predetermined bias voltage being applied to the base of said bias transistor the collector and the emitter of said bias transistor being connected to said output of said high-precision current mirror circuit and to said second constant current circuit, respectively; and
   (6) an output terminal connected to said output of said high-precision current mirror circuit and to said collector of said bias transistor.

2. A differential amplification circuit as set forth in claim 1 wherein said differential paired transistors and said bias transistor are built in a semiconductor integrated circuit so that the characteristics of said transistors are made in agreement with one another.

3. A differential amplification circuit as set forth in claim 2 wherein Darlington-connected transistors are disposed between said first constant current circuit and the emitters of said differential paired transistors.

* * * * *